(12) United States Patent
Schmidt

(10) Patent No.: US 8,013,340 B2
(45) Date of Patent: Sep. 6, 2011

(54) SEMICONDUCTOR DEVICE WITH SEMICONDUCTOR BODY AND METHOD FOR THE PRODUCTION OF A SEMICONDUCTOR DEVICE

(75) Inventor: Gerhard Schmidt, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 255 days.

(21) Appl. No.: 12/242,101

(22) Filed: Sep. 30, 2008

(65) Prior Publication Data

US 2010/0078756 A1   Apr. 1, 2010

(51) Int. Cl.
    H01L 29/04   (2006.01)
(52) U.S. Cl. .................... 257/63; 257/E29.08
(58) Field of Classification Search .......... 257/63, 257/E29.08
    See application file for complete search history.

(56) References Cited

U.S. PATENT DOCUMENTS

| | | | |
|---|---|---|---|
| 5,039,358 A * | 8/1991 | Birkle et al. | 148/33.3 |
| 5,559,367 A | 9/1996 | Cohen et al. | |
| 7,187,058 B2 | 3/2007 | Schmidt | |
| 2001/0040006 A1 | 11/2001 | Pompeo et al. | |
| 2002/0182968 A1 * | 12/2002 | Yamazaki et al. | 445/24 |
| 2003/0176063 A1 * | 9/2003 | Kakamu | 438/687 |
| 2003/0183900 A1 * | 10/2003 | Barthelmess et al. | 257/500 |
| 2004/0065902 A1 * | 4/2004 | Yamazaki et al. | 257/200 |
| 2005/0085072 A1 * | 4/2005 | Kim et al. | 438/684 |
| 2005/0106825 A1 * | 5/2005 | You et al. | 438/301 |
| 2005/0194662 A1 * | 9/2005 | Schmidt et al. | 257/646 |
| 2005/0233509 A1 * | 10/2005 | Satou | 438/158 |
| 2007/0138542 A1 * | 6/2007 | Schmidt | 257/328 |
| 2007/0218650 A1 * | 9/2007 | Takayama et al. | 438/458 |
| 2009/0008723 A1 * | 1/2009 | Schmidt | 257/409 |
| 2009/0009505 A1 * | 1/2009 | Koyama | 345/212 |
| 2009/0195154 A1 * | 8/2009 | Yamazaki et al. | 313/505 |
| 2010/0052047 A1 * | 3/2010 | Schmidt | 257/330 |

FOREIGN PATENT DOCUMENTS

EP    0400178    12/1990

OTHER PUBLICATIONS

J.C. Angus et al., "Carbon Thin Films" in "Plasma Deposited Thin Films", J. Mort and F. Jansen Eds., CRC Press 1986, Charter 4.
M. Otsuki et al., "1200V FS-IGBT Module with Enhanced Dynamic Clamping Capability", Proc. ISPSD, 2004, pp. 339-342.

* cited by examiner

*Primary Examiner* — Allan R Wilson
(74) *Attorney, Agent, or Firm* — Dicke, Billig & Czaja, PLLC

(57) ABSTRACT

A semiconductor device includes a semiconductor body with a front-sided surface. An active cell region with a semiconductor device structure and an edge region surrounding the active cell region are arranged in the semiconductor body. The front-sided surface of the semiconductor body includes a passivation layer over the edge region and over the active cell region. The passivation layer includes a semiconducting insulation layer of a semiconducting material, the bandgap of which is greater than the bandgap of the material of the semiconductor body.

18 Claims, 22 Drawing Sheets

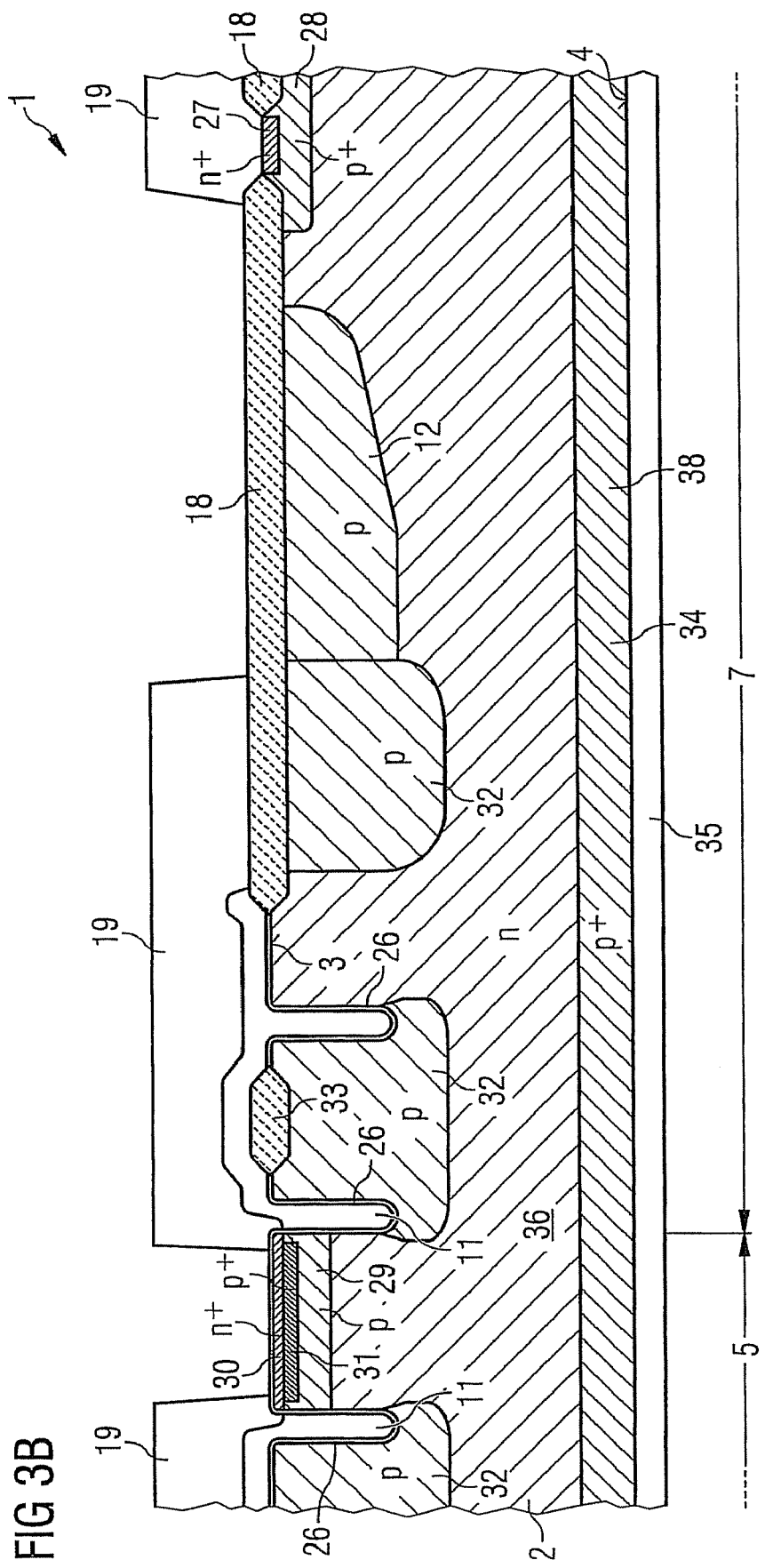

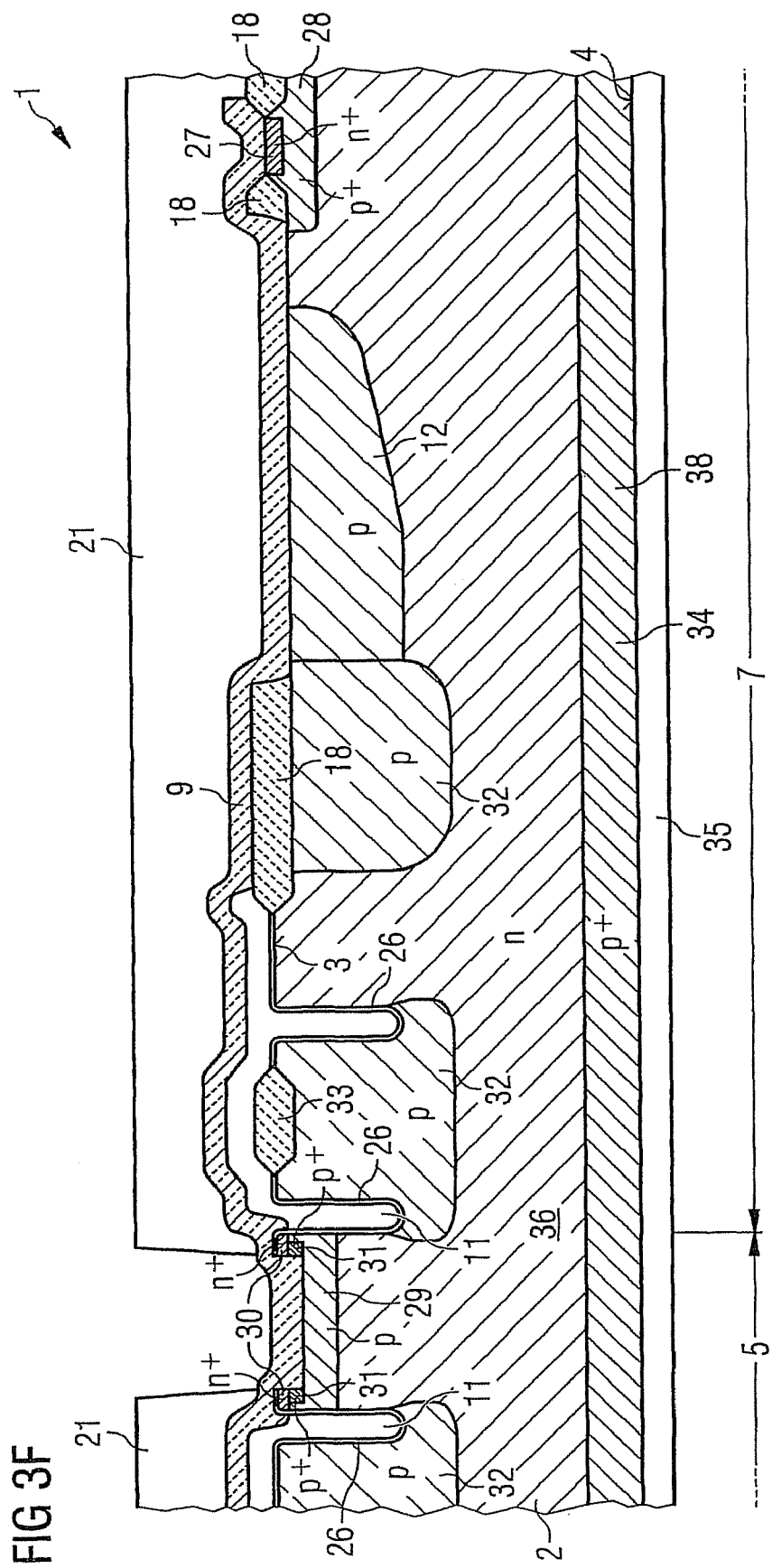

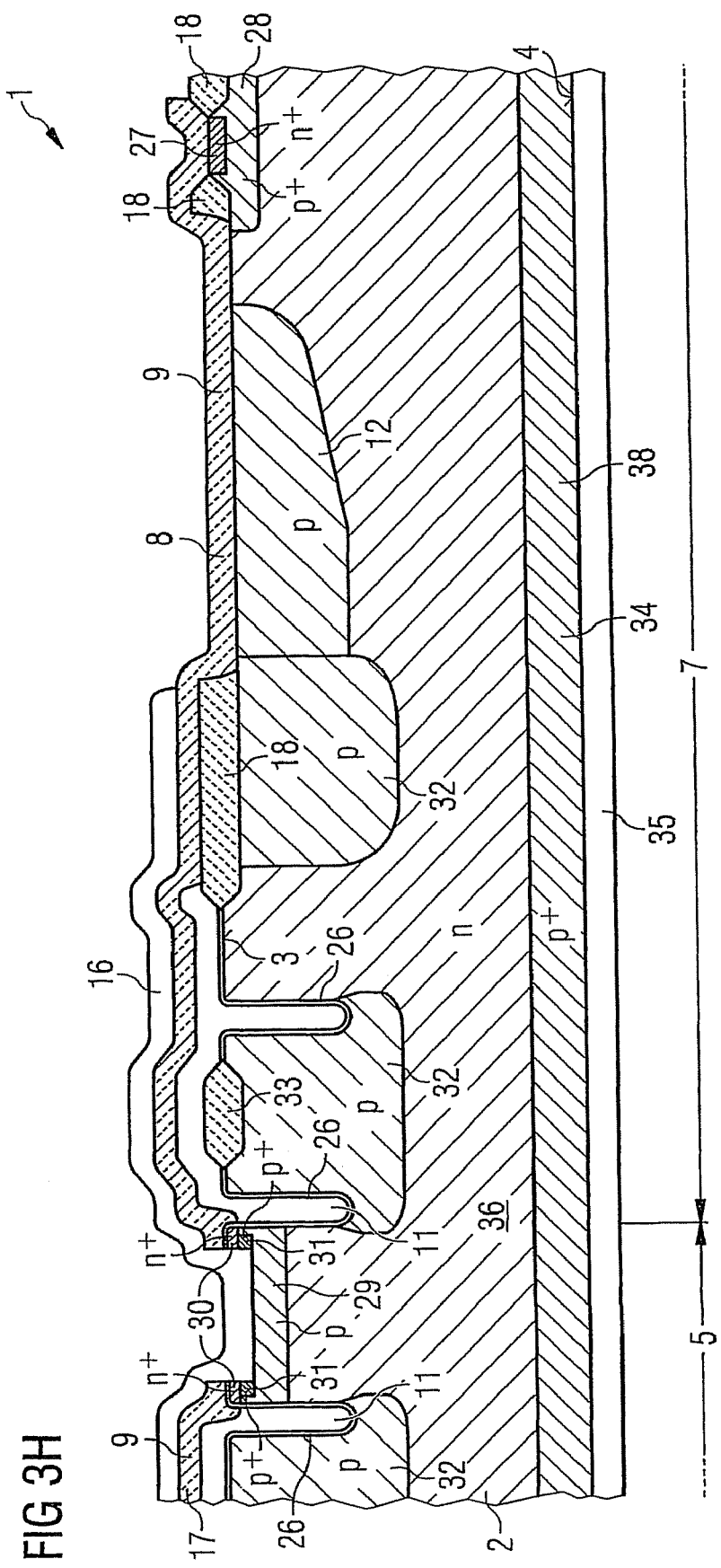

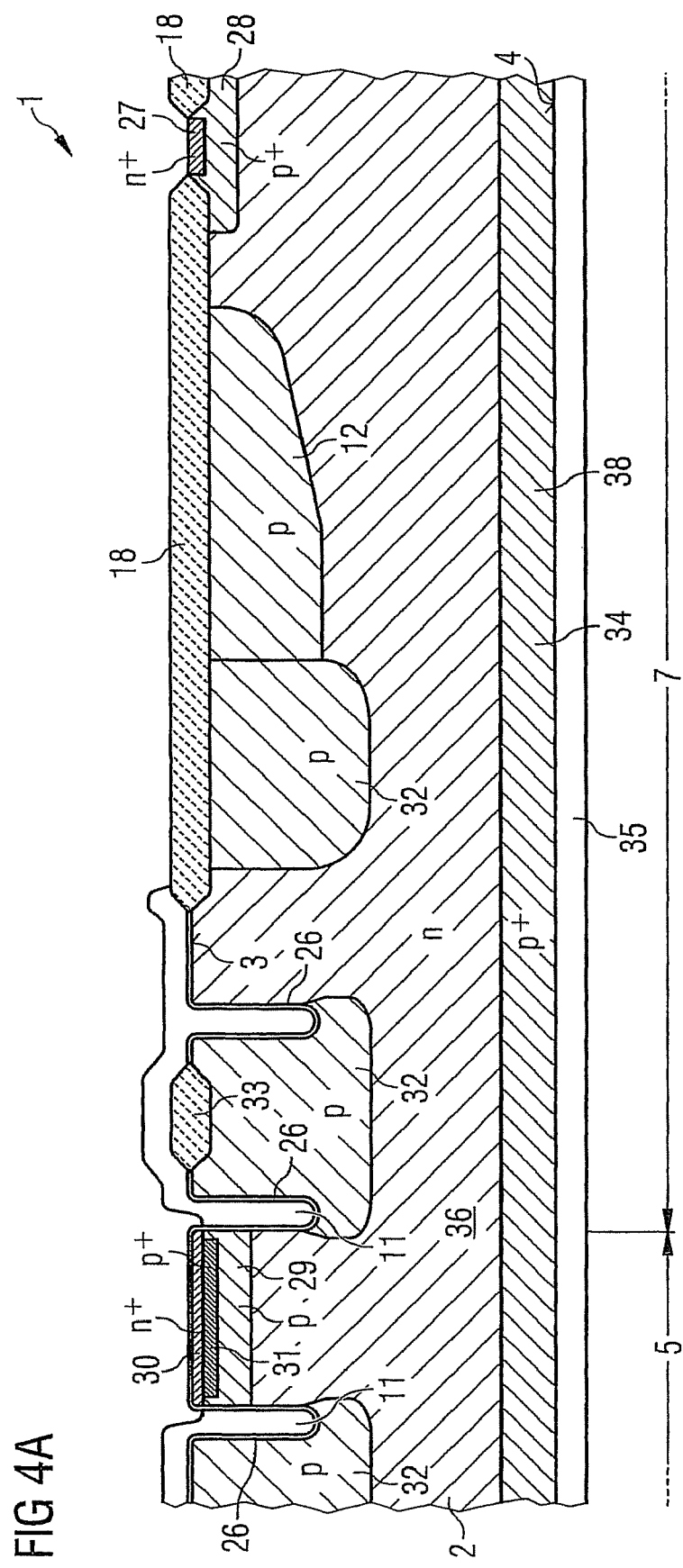

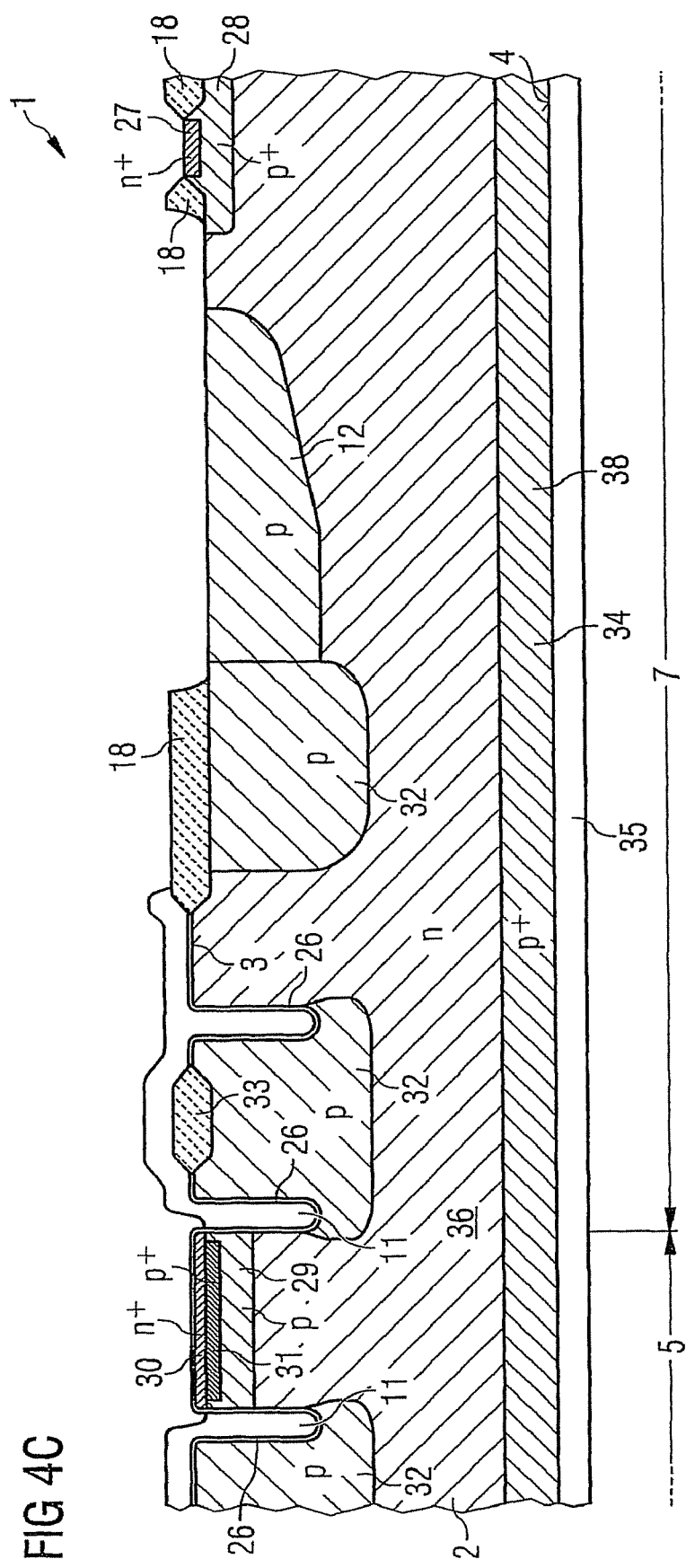

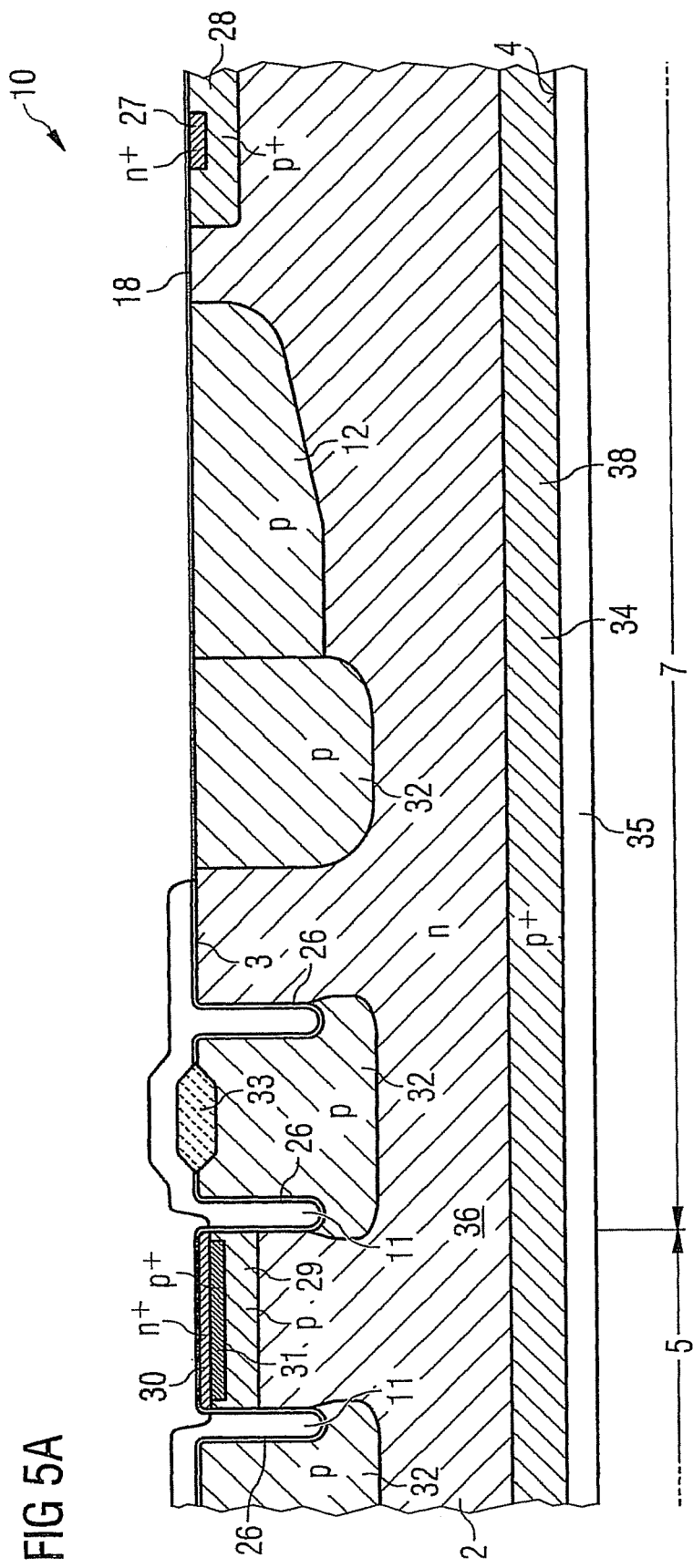

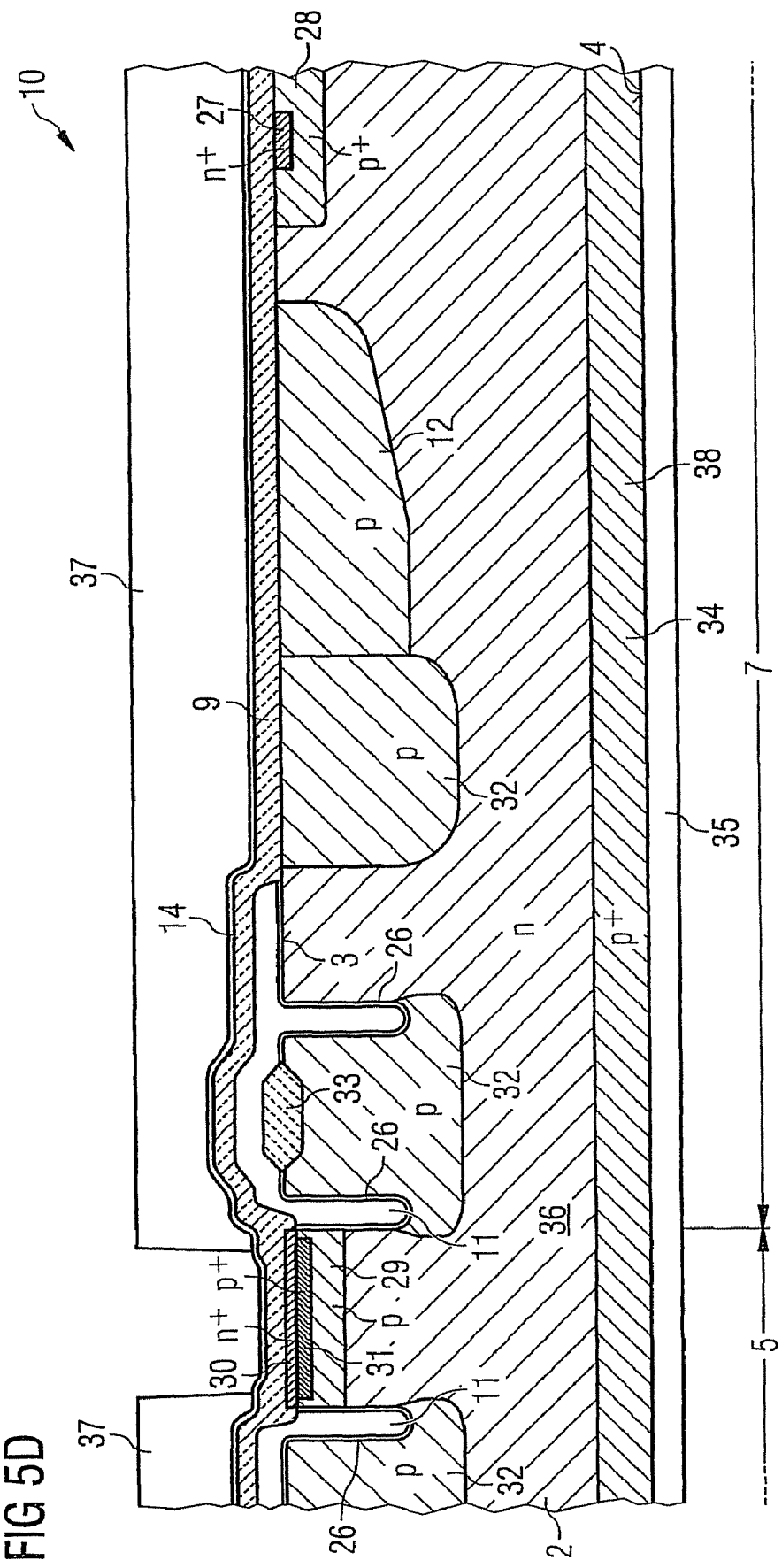

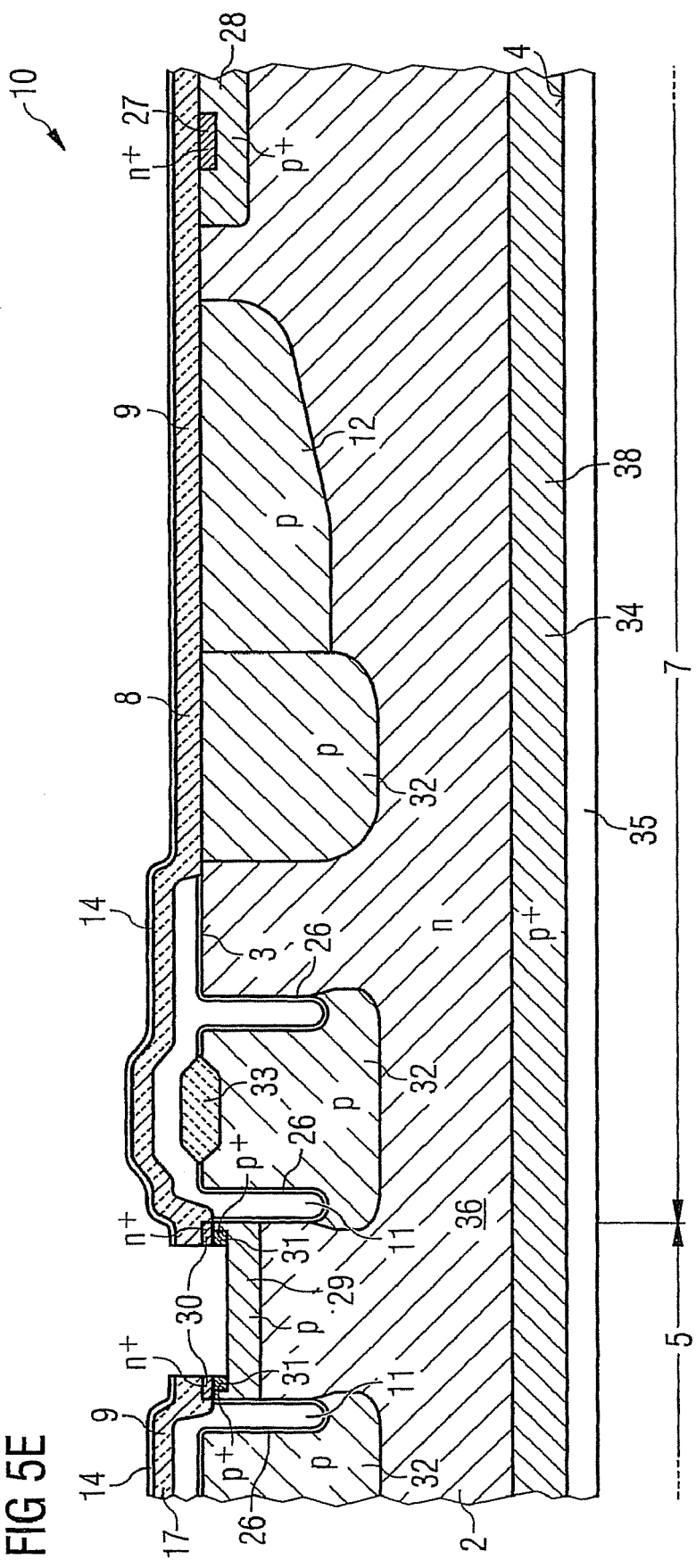

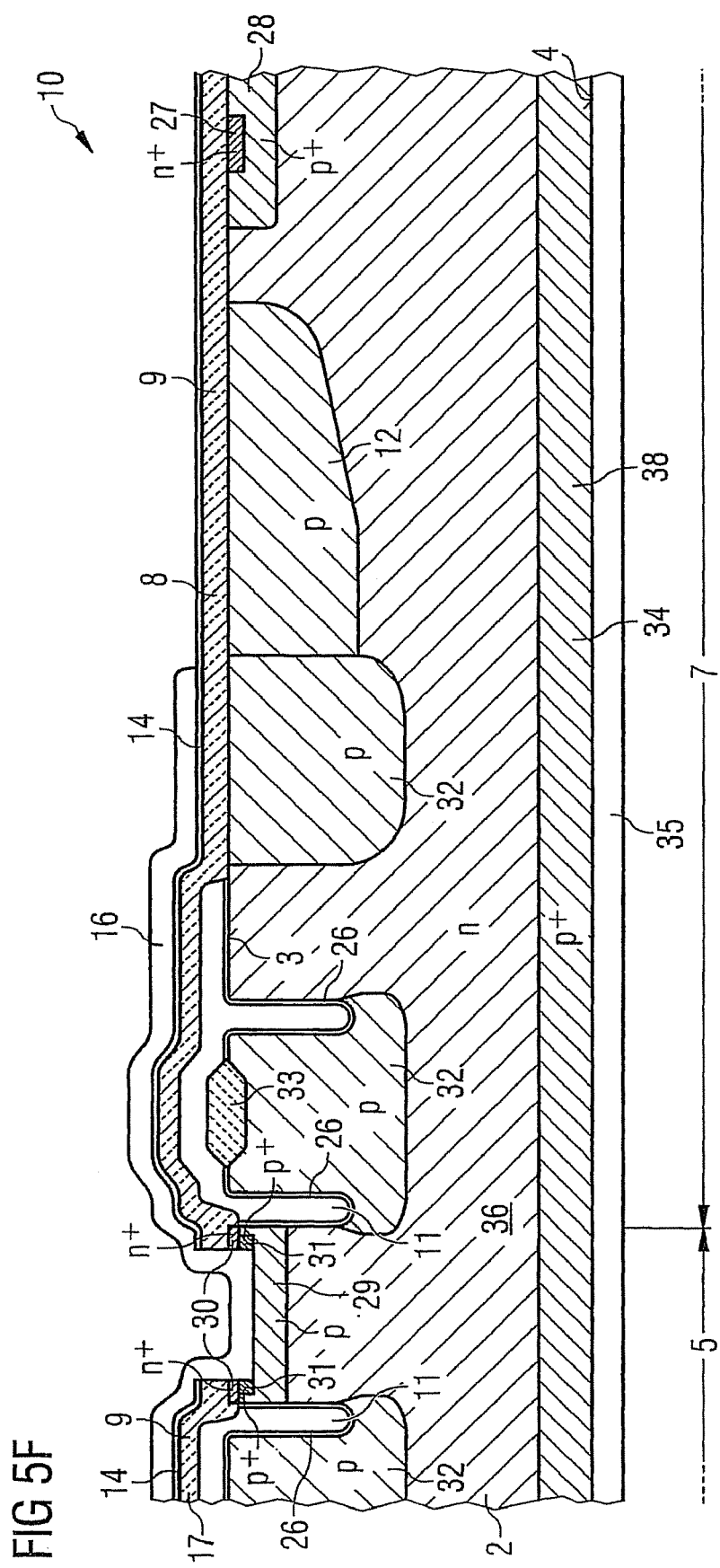

SEMICONDUCTOR DEVICE WITH SEMICONDUCTOR BODY AND METHOD FOR THE PRODUCTION OF A SEMICONDUCTOR DEVICE

BACKGROUND

For achieving potential properties at the surface of a semiconductor device which are stable in the long term, it is possible to apply a suitable passivation layer to the surface of the semiconductor device. The semiconductor device includes a semiconductor body which contains an active cell region and an adjoining inactive edge region, which encloses the active cell region and which extends to the edge of the semiconductor body.

For these and other reasons, there is a need for the present invention.

SUMMARY

In one embodiment, a semiconductor device includes a semiconductor body with a front-sided surface. An active cell region with a semiconductor device structure and an edge region surrounding the active cell region are arranged in the semiconductor body. The front-sided surface of the semiconductor body includes a passivation layer over the edge region and over the active cell region, the passivation layer including a semiconducting insulation layer of a semiconducting material, the bandgap of which is greater than the bandgap of the material of the semiconductor body.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 3A to 3H illustrate a method for the production of a semiconductor device according to FIG. 1;

FIGS. 4A to 4F illustrate a method for the production of a semiconductor device according to FIG. 1;

FIGS. 5A to 5F illustrate a method for the production of a semiconductor device according to FIG. 2.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
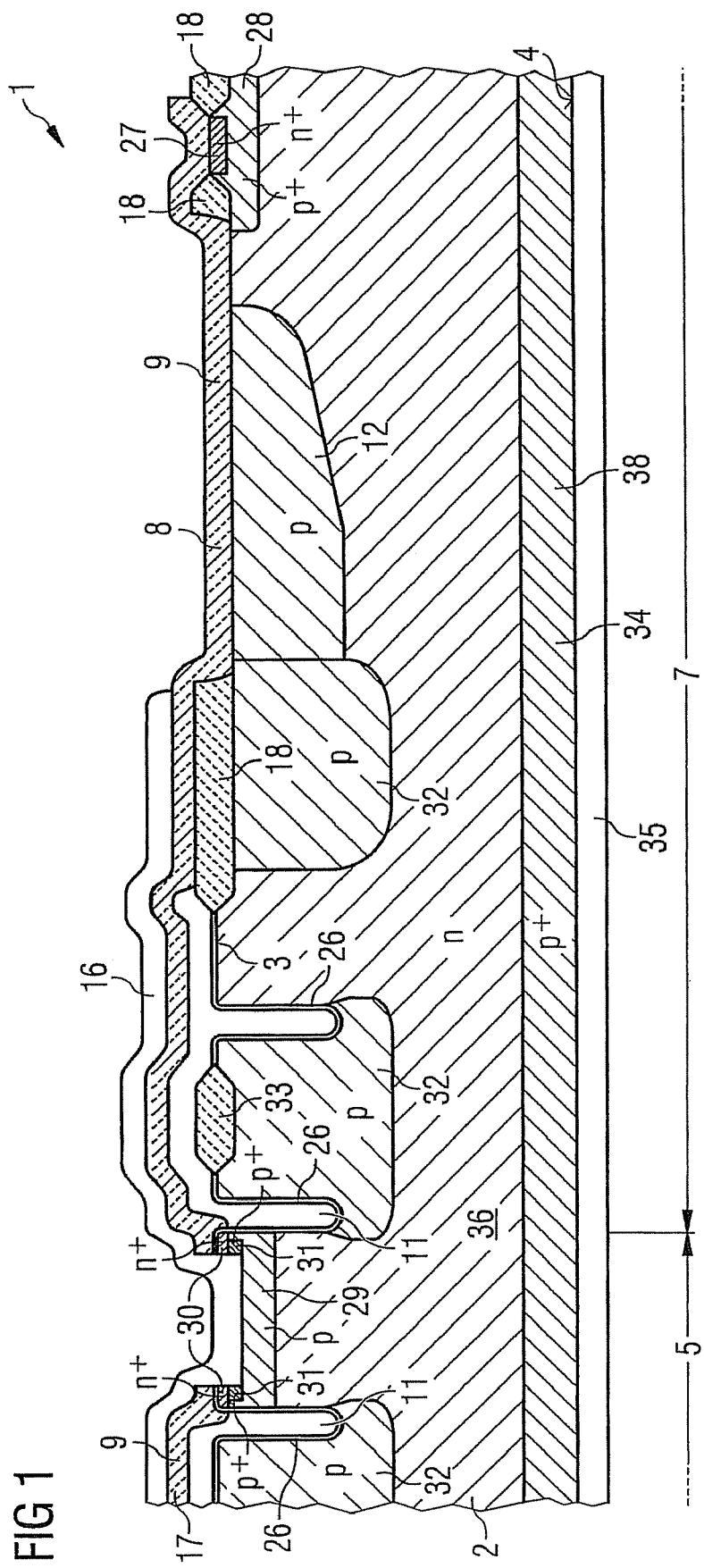
FIG. 1 illustrates a schematic cross section through a section of a semiconductor device.

FIG. 1 illustrates a schematic cross section through a section of a semiconductor device 1. In this embodiment, the semiconductor device 1 has a semiconductor body 2 with a front-sided surface 3 and a back-sided surface 4. In an active cell region 5, for example a high voltage resistant semiconductor device structure is arranged, and at least one pn-junction is present in an edge region 7 surrounding the active cell region 5. The front-sided surface 3 of the semiconductor body 2 includes a passivation layer 8 over the edge region 7 and over the active cell region 5, the passivation layer 8 containing a semiconducting insulation layer 9 of a semiconducting material, the bandgap of which is greater than the bandgap of the material of the semiconductor body 2.

The semiconducting material of the semiconducting insulation layer 9 may have an interface state density on the edge region 7 and on the active cell region 5, which is greater than the quotient of the breakdown charge and the bandgap of the material of the semiconductor body 2.

Silicon is typically provided as material of the semiconductor body 2. Moreover, silicon carbide may be provided or a material of a III/V-semiconductor, for example GaAs.

In the illustrated embodiment, the active cell region includes a high voltage resistant semiconductor device structure for at least one bipolar semiconductor device provided by a n-channel IGBT (insulated gate bipolar transistor).

For this, the semiconductor device 1 has an emitter region 30 with a $n^+$-doping in a near-surface region of the front-sided surface 3. The $n^+$-doped emitter region 30 is adjoined in the vertical direction towards the back-sided surface 4 by a p-doped body zone 29. An electrically conducting layer 16 contacts both the body zone 29 and the emitter region 30. A $p^+$-doped region 31 arranged partially between the conducting layer 16 and the body zone 29 provides a reduction of the contact resistance between the electrically conducting layer 16 and the body zone 29. A metal or polysilicon is for example provided as material of the electrically conducting layer 16.

The semiconductor device 1 can be switched from a blocking state to a conducting state by applying a positive voltage to a gate electrode which in the illustrated embodiment is a trenchgate electrode 11 and the associated formation of a n-conducting channel in a region of the body zone 29 arranged next to the trenchgate electrode 11. The trenchgate electrode 11 contains an electrically conducting material, for example a metal or polysilicon. An insulation layer 26, typically containing an oxide, provides the electrical insulation of the trenchgate electrode 11 from the surrounding material of the semiconductor body 2. The insulation layer 26 has a slightly smaller thickness between the emitter region 30 and the semiconducting insulation layer 9 above the emitter region 30 in the direction towards the front-sided surface 3 of the semiconductor body 2 than in the other regions. Therefore, the insulation layer 26 is also called residual oxide in this region.

In the vertical direction towards the back-sided surface 4, the body zone 29 is adjoined by an n-doped drift zone 36. A $p^+$-doped layer 38 in a near-surface region of the back-sided surface 4 provides a collector region 34. The collector region 34 is electrically contacted via a collector electrode 35, which contains for example a metal.

The p⁺-doped layer 38 also serves as a source for p-type charge carriers and thus provides the bipolar behavior of the semiconductor device 1. Floating, p-doped regions 32 arranged between two adjacent trenches outside the body zone 29 and the drift zone 36 provide a retention effect for the p-type charge carriers before the leaking-away via the p-doped body zone 29 and thereby an improved behavior of the semiconductor device 1 in the conducting state, without affecting its latch-up resistance. Oxidation layers 18 and 33 which have a higher thickness than the insulation layer 26 are arranged partially between the floating p-doped regions 32 and the trenchgate electrodes 11 and may provide a reduction of the gate collector capacitance.

In addition to the semiconductor device structure for at least one n-channel IGBT, in other embodiments a semiconductor device structure may be provided for at least one other bipolar semiconductor device, as for example a p-channel IGBT or a PIN diode, or for at least one unipolar semiconductor device, as for example a MOSFET, which may be a n-channel or a p-channel MOSFET, or a Schottky diode.

In the illustrated embodiment, the edge region 7 of the semiconductor device 1 includes at least one variably laterally doped doping material zone 12, in the following shortened to VLD zone. The VLD zone 12 has a p-doping which is reduced laterally towards the edge of the semiconductor body 2 to the concentration of doping material of the drift zone 36. As a result, the electric field strength is reduced in the blocking state of the semiconductor device 1 in the edge region 7, where the pn-junction of the semiconductor device structure reaches the front-sided surface 3 such that a moderate field distribution is obtained and a premature breakthrough of the semiconductor device 1 under blocking load is avoided.

In other embodiments, at least one guard ring or at least one field plate is arranged in the edge region 7 of the semiconductor device 1. Furthermore, combinations of VLD zone 12, guard ring and field plate may also be provided for the edge region 7.

The edge region 7 may further include a channel stopper. The channel stopper may limit the depletion region at the outer edge of the semiconductor device 1 when the pn-junction is reverse-biased. For this purpose, the channel stopper includes in a near-surface region of the front-sided surface 3 a p⁺-doped region 28 and a n⁺-doped region 27 completely contained within the p⁺-doped region 28, whereby the outermost edge of the semiconductor device 1 can be set at collector potential.

The semiconducting insulation layer 9 is arranged on the VLD zone 12 in the edge region 7, and provides a passivation layer 8 for the protection of the front-sided surface 3 in the edge region 7 with regard to external charges which could have an adverse effect on the blocking behavior of the semiconductor device 1. Moreover, the semiconducting insulation layer 9 is arranged between the trenchgate electrode 11 and the electrically conducting layer 16 in the active cell region 5, and insulates the trenchgate electrode 11 from the electrically conducting layer 16. The semiconducting insulation layer 9 provides an inter-metal dielectric 17 in the active cell region 5. The semiconducting insulation layer 9 is thus arranged both in the edge region 7 and in the active cell region 5. The simultaneous use of the semiconducting insulation layer 9 as passivation layer 8 in the edge region 7 and as inter-metal dielectric 17 in the active cell region 5 provides a reduction of the lithographic processes required in the production process and thus a faster and more cost-effective production method.

The semiconducting material of the semiconducting insulation layer 9 may contain amorphous carbon. It is also possible that the semiconducting material of the semiconducting insulation layer 9 contains amorphous carbon doped with silicon or hydrogenated amorphous carbon.

The resistivity of the semiconducting material of the semiconducting insulation layer 9 is typically in the range of $10^{12}$ Ωcm at ambient temperature.

Figure 2:
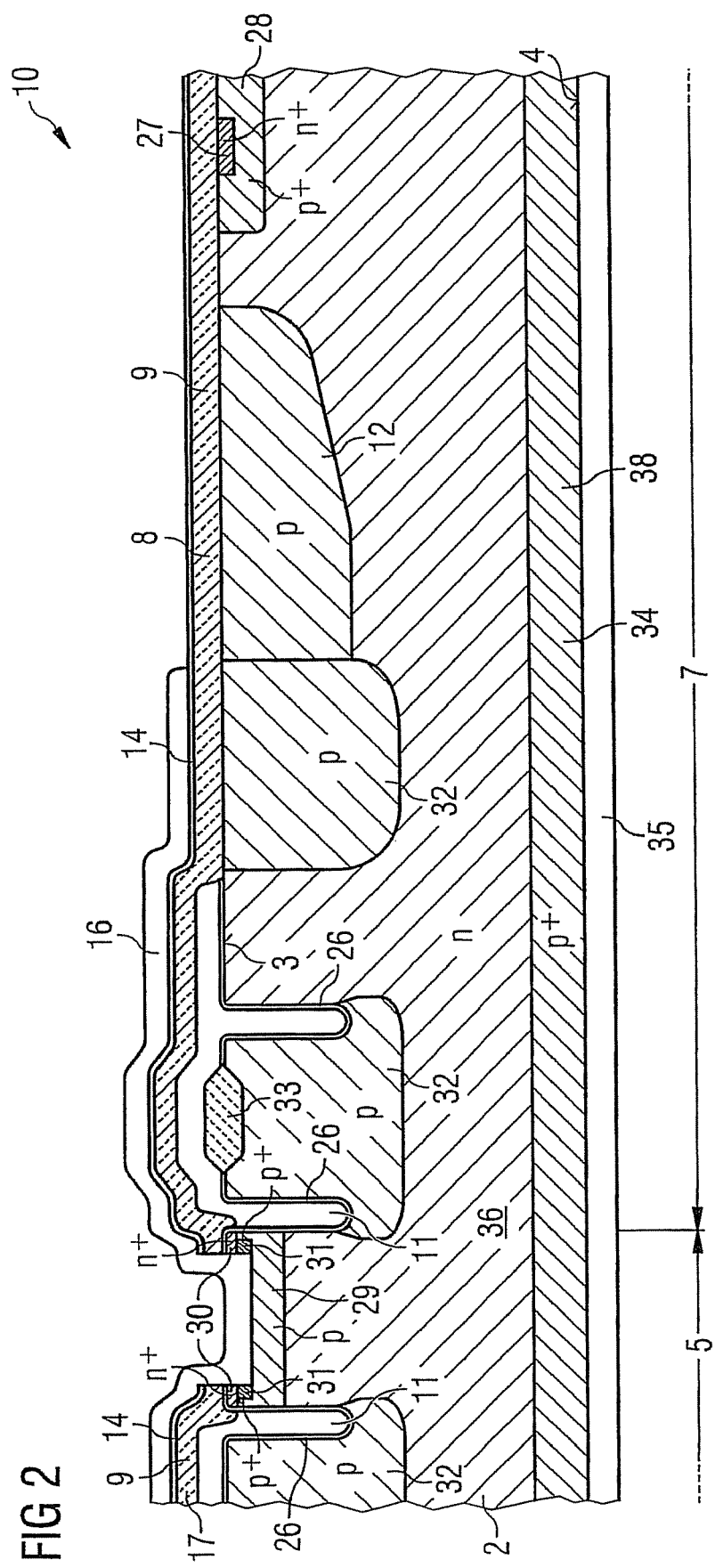
FIG. 2 illustrates a schematic cross section through a section of a semiconductor device.

FIG. 2 illustrates a schematic cross section through a section of a semiconductor device 10. Components of the same function as those in FIG. 1 are identified by the same reference numbers and not explained again below.

In this embodiment, the semiconductor device 10 contains a further layer 14 at least partially between the semiconducting insulation layer 9 and the conducting layer 16. The further layer 14 may provide a reduction of the parasitic gate emitter current. Additionally, the further layer 14 may increase the adhesion between the semiconducting insulation layer 9 and the conducting layer 16.

The further layer 14 may contain silicon nitride. Moreover, the further layer 14 may contain a silicate glass, chosen from the group of the boron phosphorous silicate glasses, the boron silicate glasses and the undoped silicate glasses. A corresponding layer 14 may also be provided in the semiconductor device 1 illustrated in FIG. 1.

The semiconductor device 10 is different from the semiconductor device 1 illustrated in FIG. 1 in that no insulation layer in the form of a residual oxide is arranged between the emitter region 30 and the semiconducting insulation layer 9 above the emitter region 30 in the direction of the front-sided surface 3. The semiconducting insulation layer 9 in the illustrated embodiment is thus arranged directly on the front-sided surface 3 of the semiconductor body 2 both in the active cell region 5 in the regions which are free from the material of the trenchgate electrode 11 and in the edge region 7.

As already described for the semiconductor device 1 illustrated in FIG. 1, the semiconducting material of the semiconducting insulation layer 9 may have an interface state density in the edge region 7 and in the active cell region 5, which is greater than the quotient of the breakdown charge and the bandgap of the material of the semiconductor body 2.

The semiconducting material of the semiconducting insulation layer 9 may contain amorphous carbon. It is also possible that the semiconducting material of the semiconducting insulation layer 9 contains amorphous carbon doped with silicon or hydrogenated amorphous carbon.

The resistivity of the semiconducting material of the semiconducting insulation layer 9 is typically in the range of $10^{12}$ Ωcm at ambient temperature.

Silicon may be provided as material of the semiconductor body 2. Furthermore, silicon carbide may be provided or a material of a III/V-semiconductor, for example GaAs.

In addition to the semiconductor device structure for at least one n-channel IGBT, in other embodiments, a semiconductor device structure may be provided for at least one other bipolar semiconductor device, as for example a p-channel IGBT or a PIN diode or for at least one unipolar semiconductor device, as for example a MOSFET, which may be a n-channel or a p-channel MOSFET, or a Schottky diode.

In the illustrated embodiment, the edge region 7 of the semiconductor device 10 includes at least one VLD zone 12. In a non-illustrated embodiment, at least one guard ring or at least one field plate is arranged in the edge region 7 of the semiconductor device 10. Furthermore, combinations of VLD zone 12, guard ring and field plate may be provided for the edge region 7.

Furthermore, a channel stopper may be provided in the edge region 7.

The simultaneous use of the semiconducting insulation layer 9 as passivation layer 8 in the edge region 7 and as inter-metal dielectric 17 in the active cell region 5 provides a reduction of the lithographic processes needed in the production process and thus a faster and more cost-effective production method. Furthermore, an optimum encapsulation of the insulation layer 26 of the trenchgate electrodes 11 in the region of the n-conducting channel formed in the conducting state of the semiconductor device 10 against alkaline contamination may be ensured.

FIGS. 3A to 3H illustrate a method for the production of a semiconductor device according to FIG. 1. Components of the same function as those in the previous figures are identified by the same reference numbers and not explained again below.

Figure 3A:
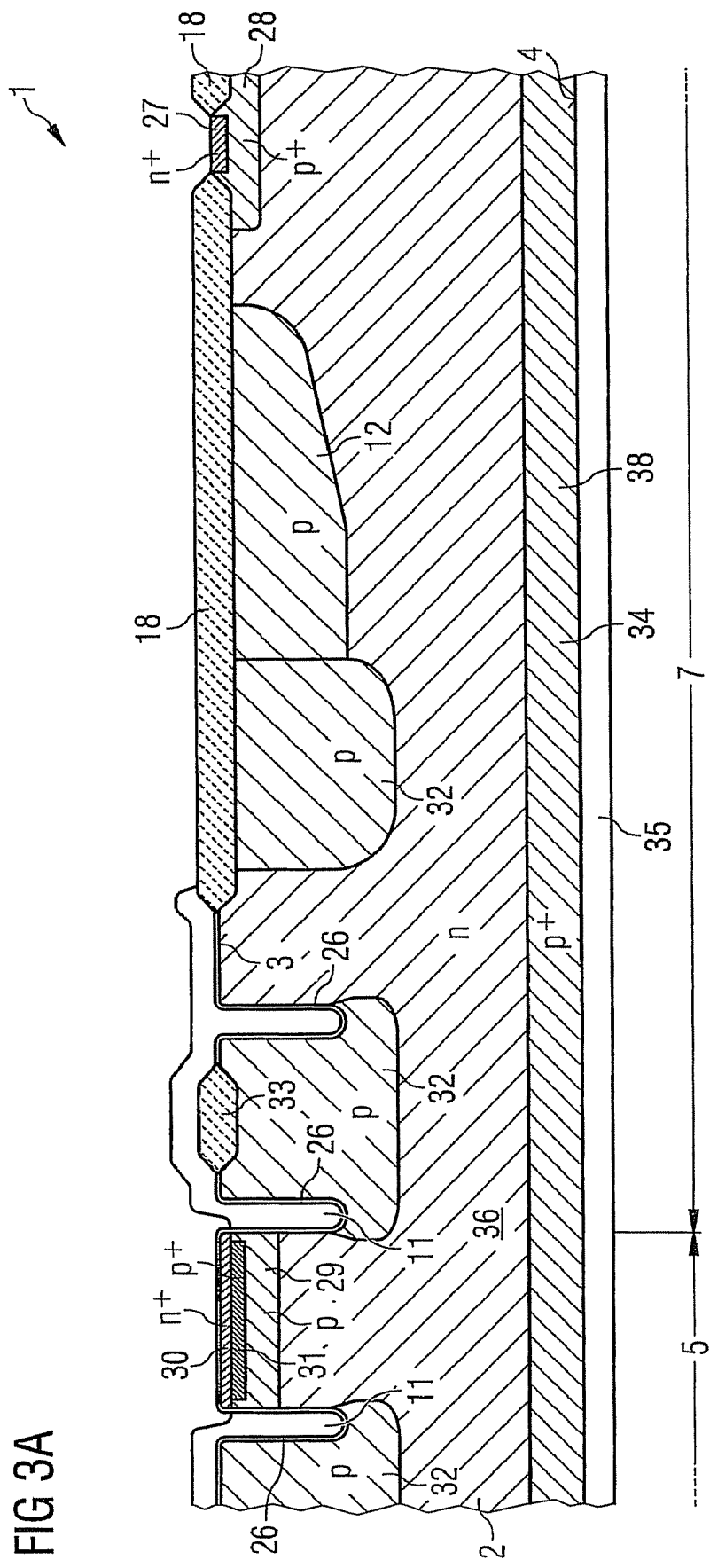

FIG. 3A illustrates a semiconductor body 2 with an active cell region 5 and an edge region 7 surrounding the active cell region 5. For example, a high voltage resistant semiconductor device structure is produced in the active cell region 5 and an edge structure is produced in the edge region 7 surrounding the active cell region 5. The production of the semiconductor device structure and of the edge structure takes place according to a standard method, which is not explained in detail here. In FIG. 3A, the semiconductor device 1 is illustrated after the production of the semiconductor device structure in the active cell region 5 and the edge structure in the edge region 7. In the illustrated embodiment, the semiconductor device structure is provided for at least one n-channel IGBT and the edge structure is provided for at least one VLD zone 12. After the production of the edge structure, a local oxidation layer 18 is applied at least partially to the front-sided surface 3 in the edge region 7.

In a further process, a photoresist mask 19 is applied to the semiconductor device 1 in the active cell region 5 and in the edge region 7. The photoresist mask 19 contains an opening in the active cell region 5, which enables a contact hole etching. The photoresist mask 19 additionally contains an opening in the edge region 7 for at least partially exposing the local oxidation layer 18 arranged there. FIG. 3B illustrates the semiconductor device 1 after the above-mentioned processes.

Figure 3C:
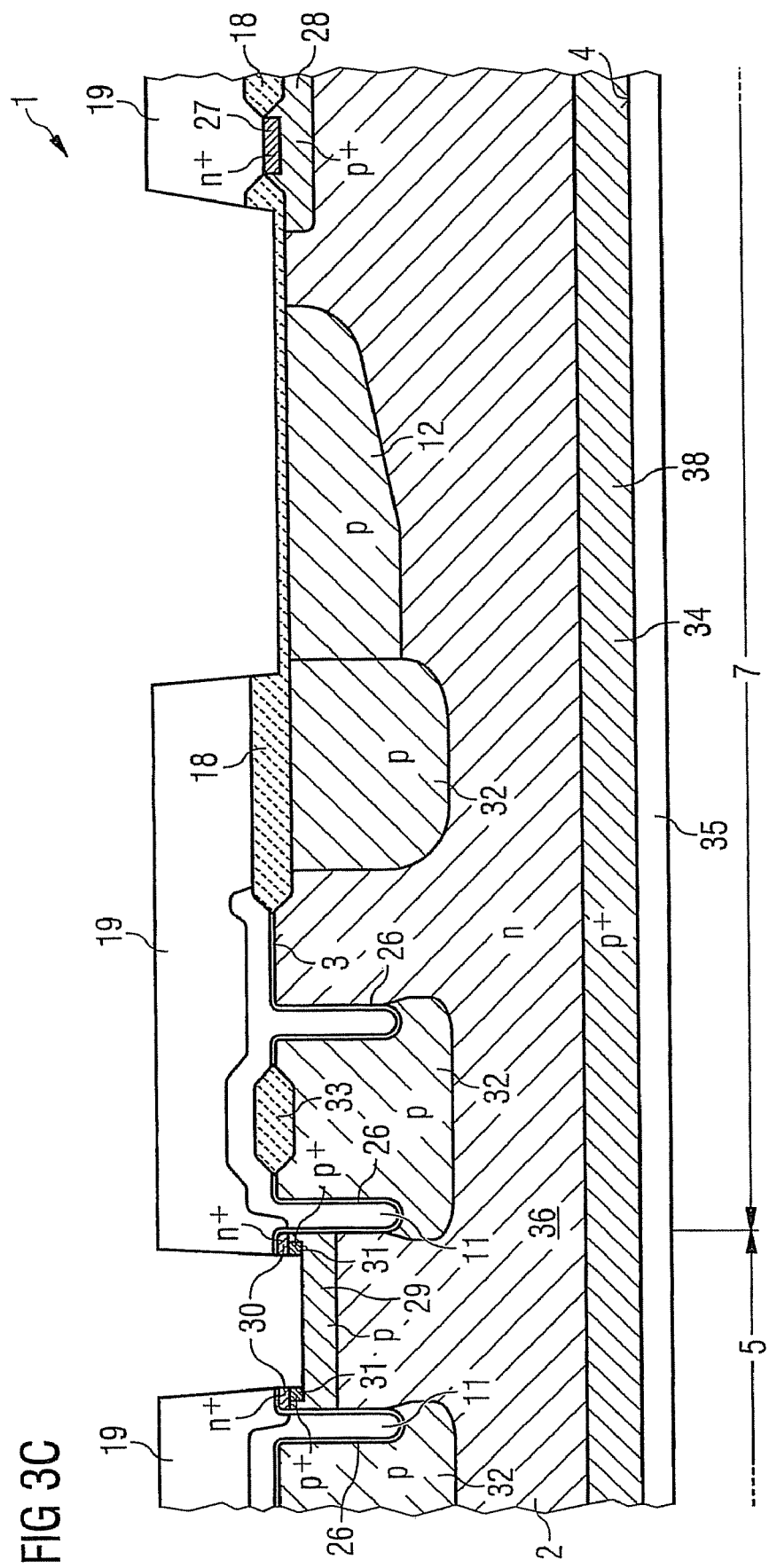

Subsequently, the contact hole etching takes place in the active cell region 5. The local oxidation layer 18 exposed at least partially in the edge region 7 provides a buffer layer for the protection against the etching of the semiconductor body 2, which typically contains silicon. The local oxidation layer 18 is thereby partially removed in the region which is not covered by the photoresist mask 19, as illustrated in FIG. 3C.

Figure 3D:
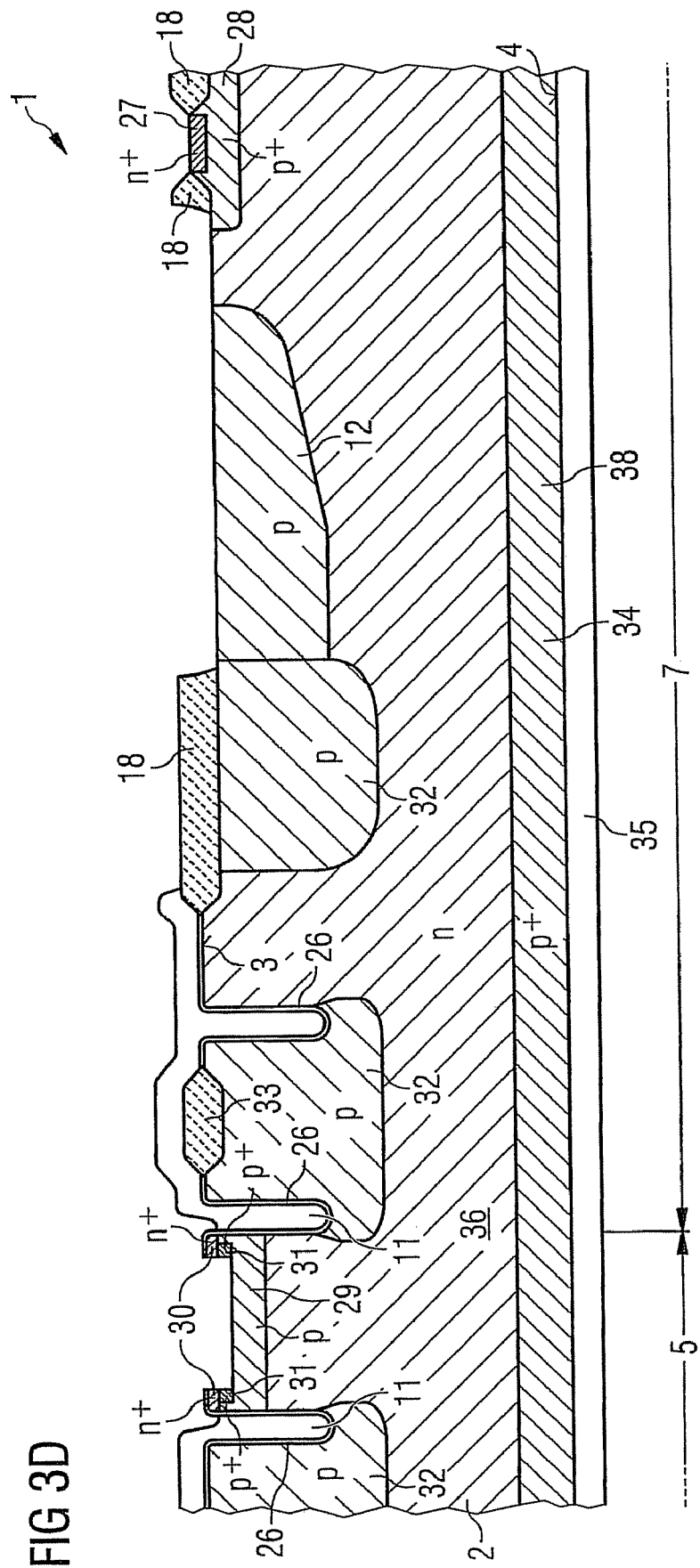

The layer remaining in this region is subsequently removed in a wet-chemical process, and the photoresist mask 19 is removed in a further process. FIG. 3D illustrates the semiconductor device 1 after the above-mentioned processes.

Figure 3E:
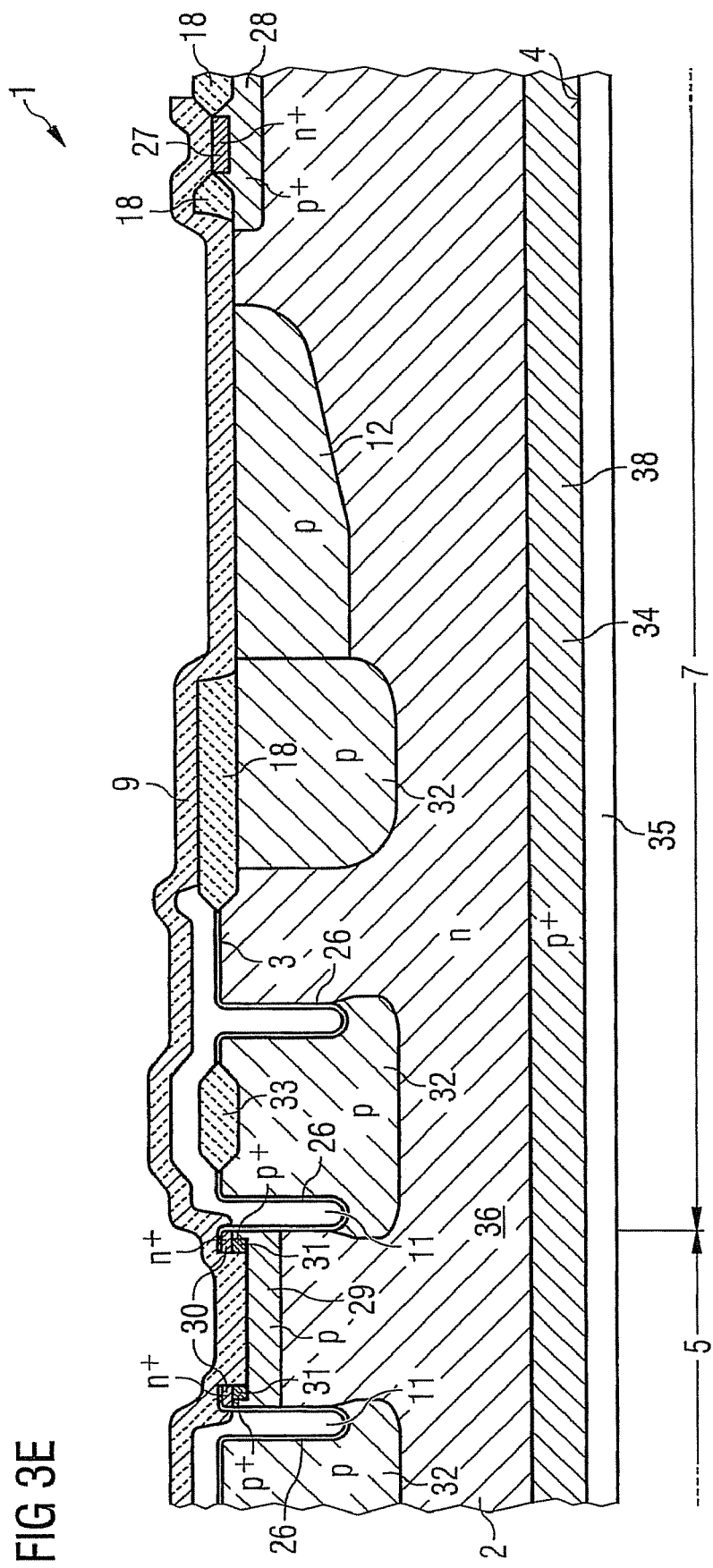

Subsequently, a semiconducting insulation layer 9 is deposited on the front-sided surface 3 of the semiconductor body 2 both on the active cell region 5 and on the edge region 7, as illustrated in FIG. 3E. A semiconducting material is used for the semiconducting insulation layer 9, the bandgap of which is greater than the bandgap of the material of the semiconductor body 2.

After the deposition of the semiconducting insulation layer 9, the contact holes in the active cell region 5 are freed from the semiconducting insulation layer 9. For this purpose, a photoresist mask 21 with corresponding openings in the active cell region 5 is applied to the semiconducting insulation layer 9. This is illustrated in FIG. 3F.

Figure 3G:
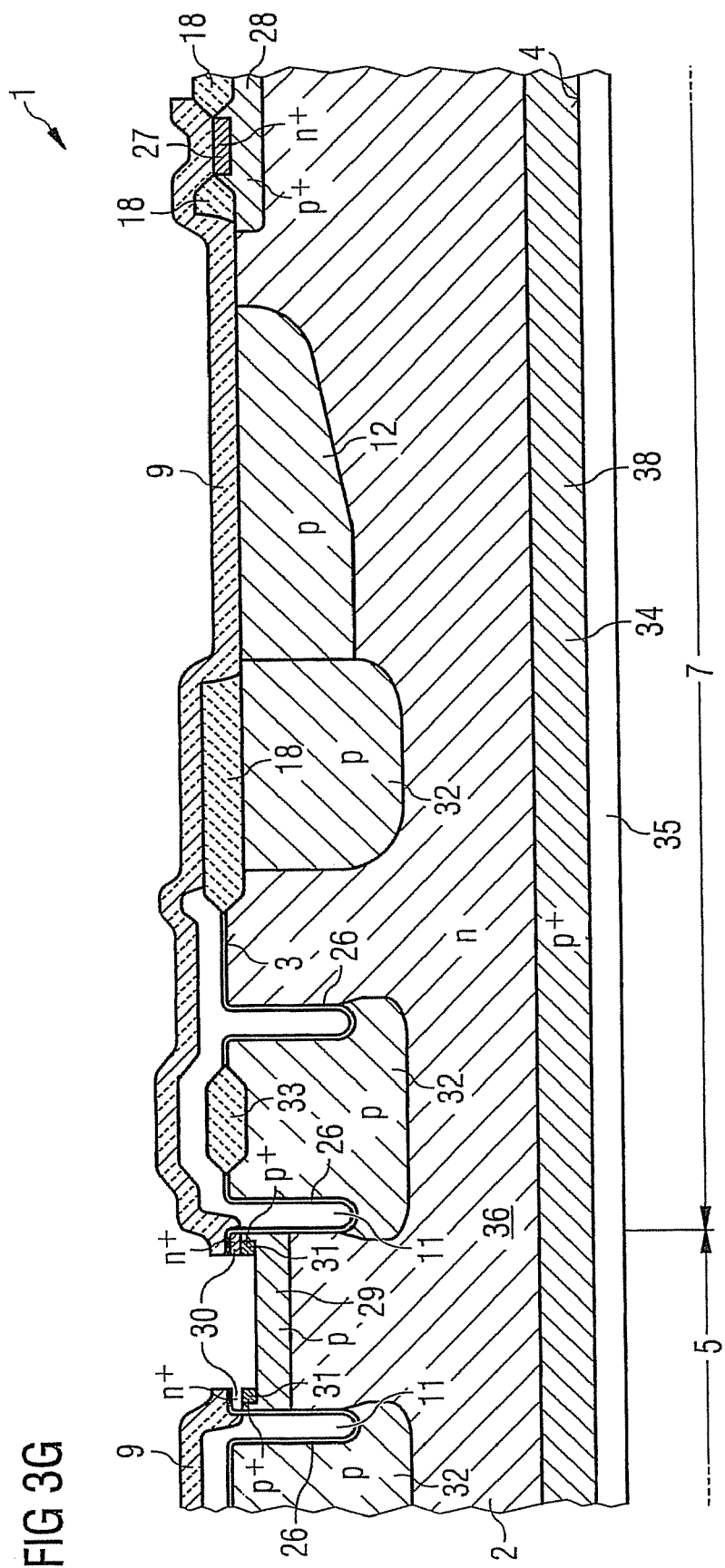

The contact holes in the active cell region 5 are freed and the photoresist mask 21 is removed in a further process. FIG. 3G illustrates the semiconductor device 1 after the above-mentioned processes.

Subsequently, a conducting layer 16 is deposited and structured at least on parts of the semiconducting insulation layer 9 and in the region of the contact holes. The semiconductor device 1 obtained in such a manner is illustrated in FIG. 3H.

FIGS. 4A to 4F illustrate a method for the production of a semiconductor device according to FIG. 1. Components of the same function as those in the previous figures are identified by the same reference numbers and not explained again below.

FIG. 4A illustrates a semiconductor device 1 after the production of for example a high voltage resistant semiconductor device structure in the active cell region 5 and an edge structure in the edge region 7 according to a standard method, which is not explained in detail here. After the production of the edge structure, a local oxidation layer 18 is applied at least partially to the front-sided surface 3 in the edge region 7.

Figure 4B:
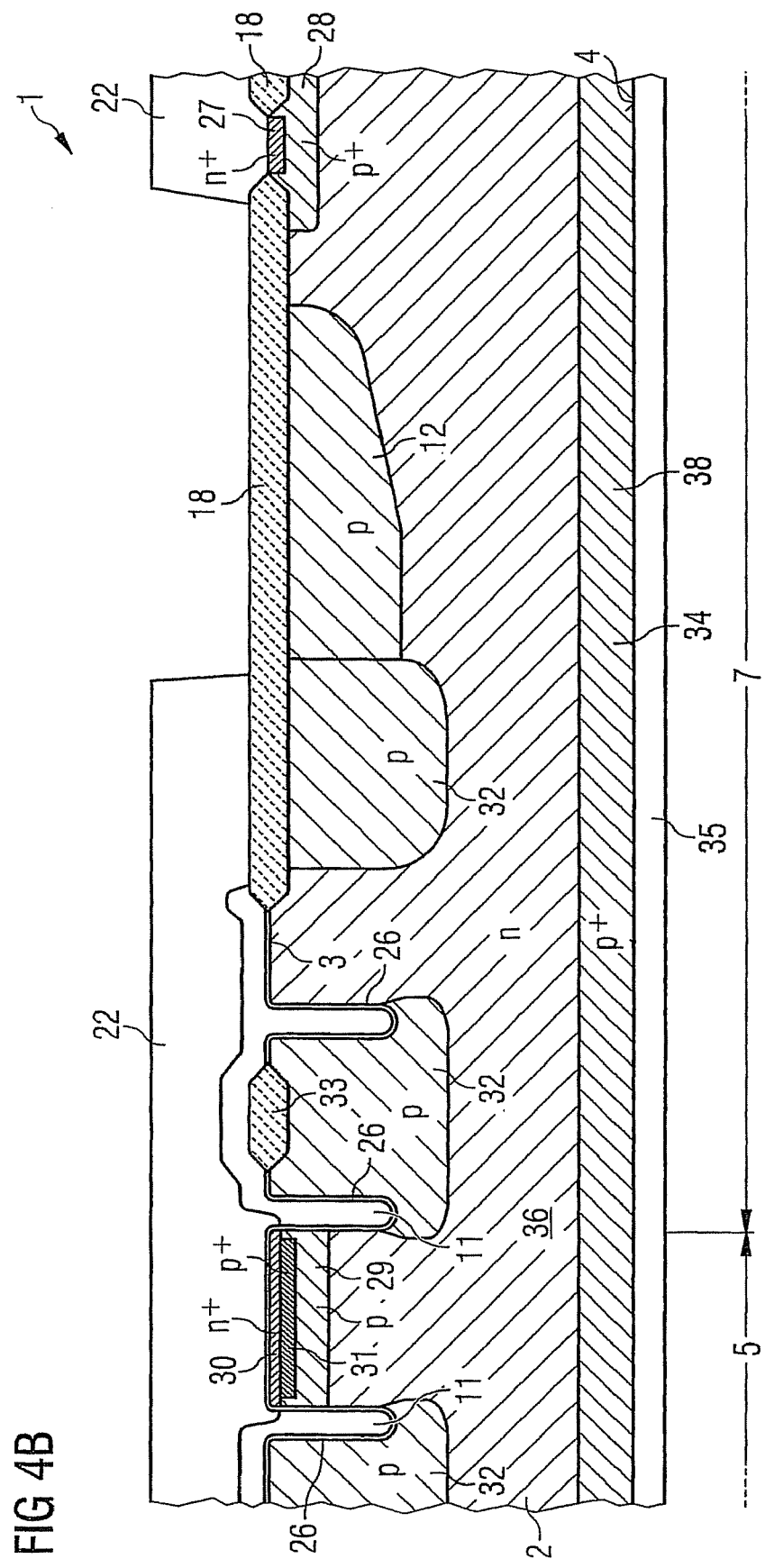

In a further process, a photoresist mask 22 is applied to the semiconductor device 1 in the active cell region 5 and in the edge region 7. The photoresist mask 22 contains an opening in the edge region 7, so that the local oxidation layer 18 arranged there is at least partially exposed. This is illustrated in FIG. 4B.

The local oxidation layer 18 is subsequently etched entirely in the exposed part in the edge region 7 and the photoresist mask 22 is removed in a further process. The semiconductor device 1 obtained in this manner is illustrated in FIG. 4C.

Figure 4D:
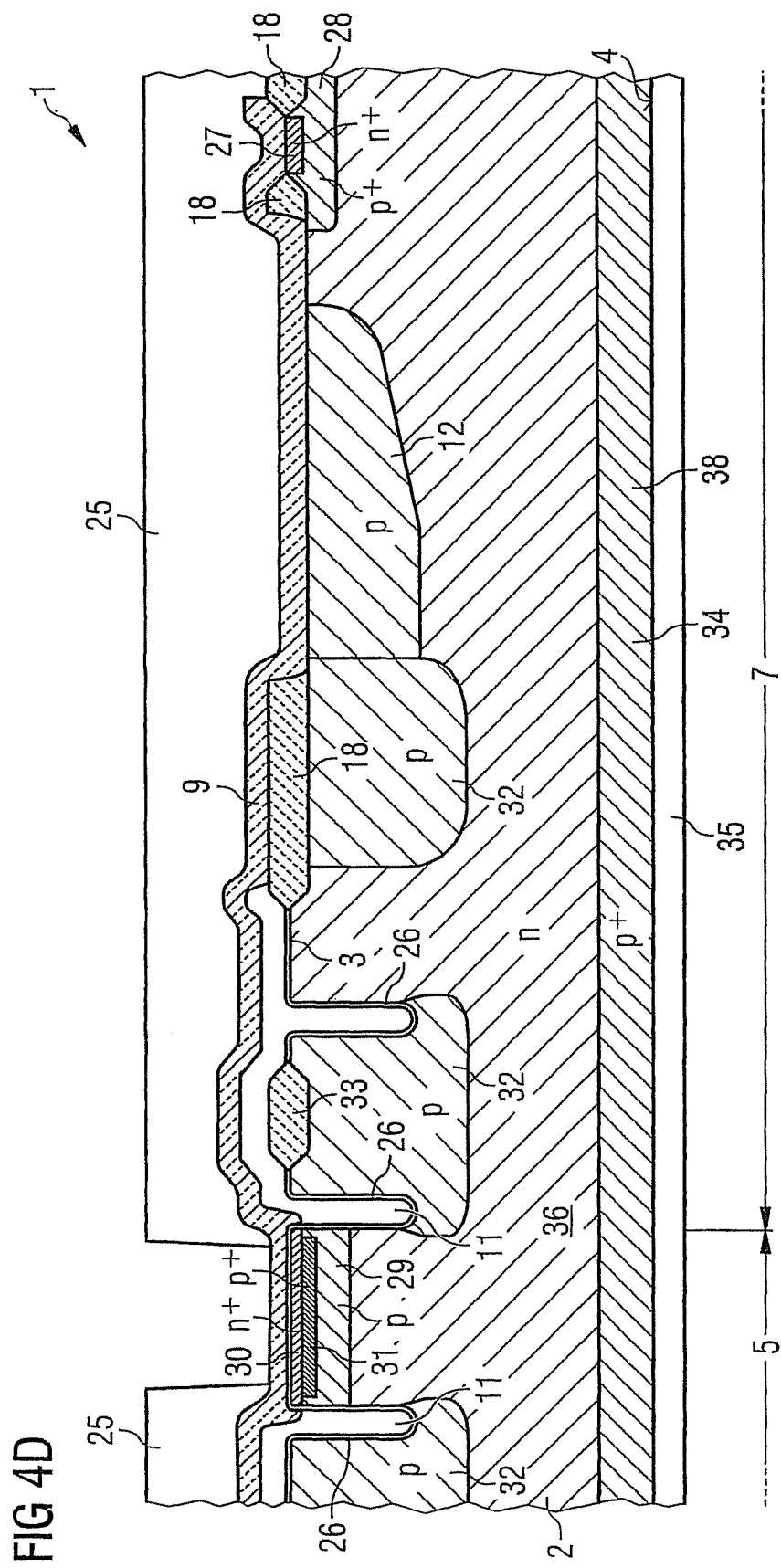

A semiconducting insulation layer 9 is subsequently deposited on the front-sided surface 3 of the semiconductor body 2 both on the active cell region 5 and on the edge region 7. A semiconducting material is provided for the semiconducting insulation layer 9, the bandgap of which is greater than the bandgap of the material of the semiconductor body 2, which typically contains silicon. Subsequently, a photoresist mask 25 is applied to the semiconducting insulation layer 9 and is structured for providing contact holes in the active cell region 5. This is illustrated in FIG. 4D.

Figure 4E:
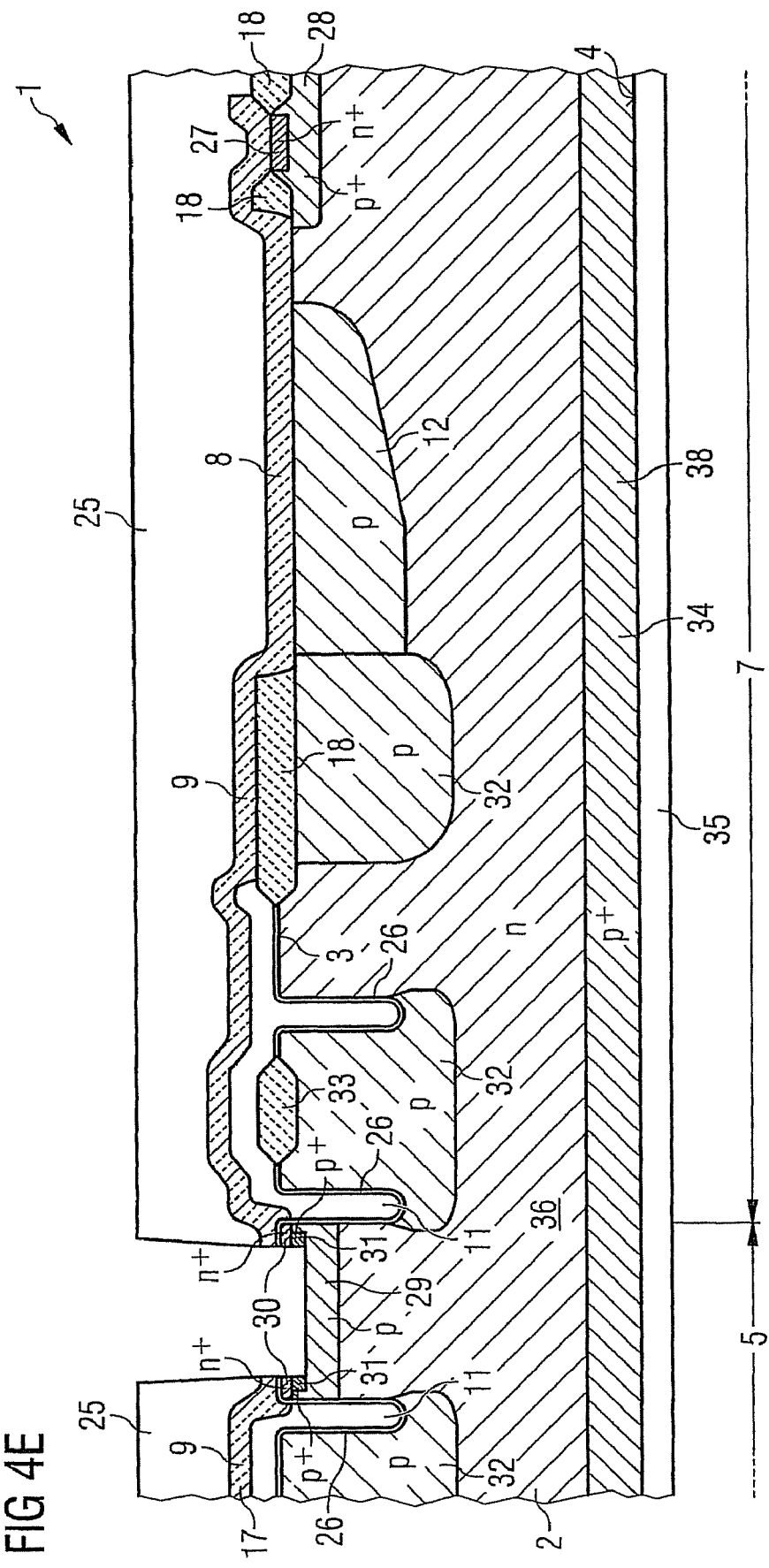

In a further process, the contact hole etching in the active cell region 5 takes place with removal of the semiconducting insulation layer 9 in the region of the contact hole openings, as illustrated in FIG. 4E.

Figure 4F:
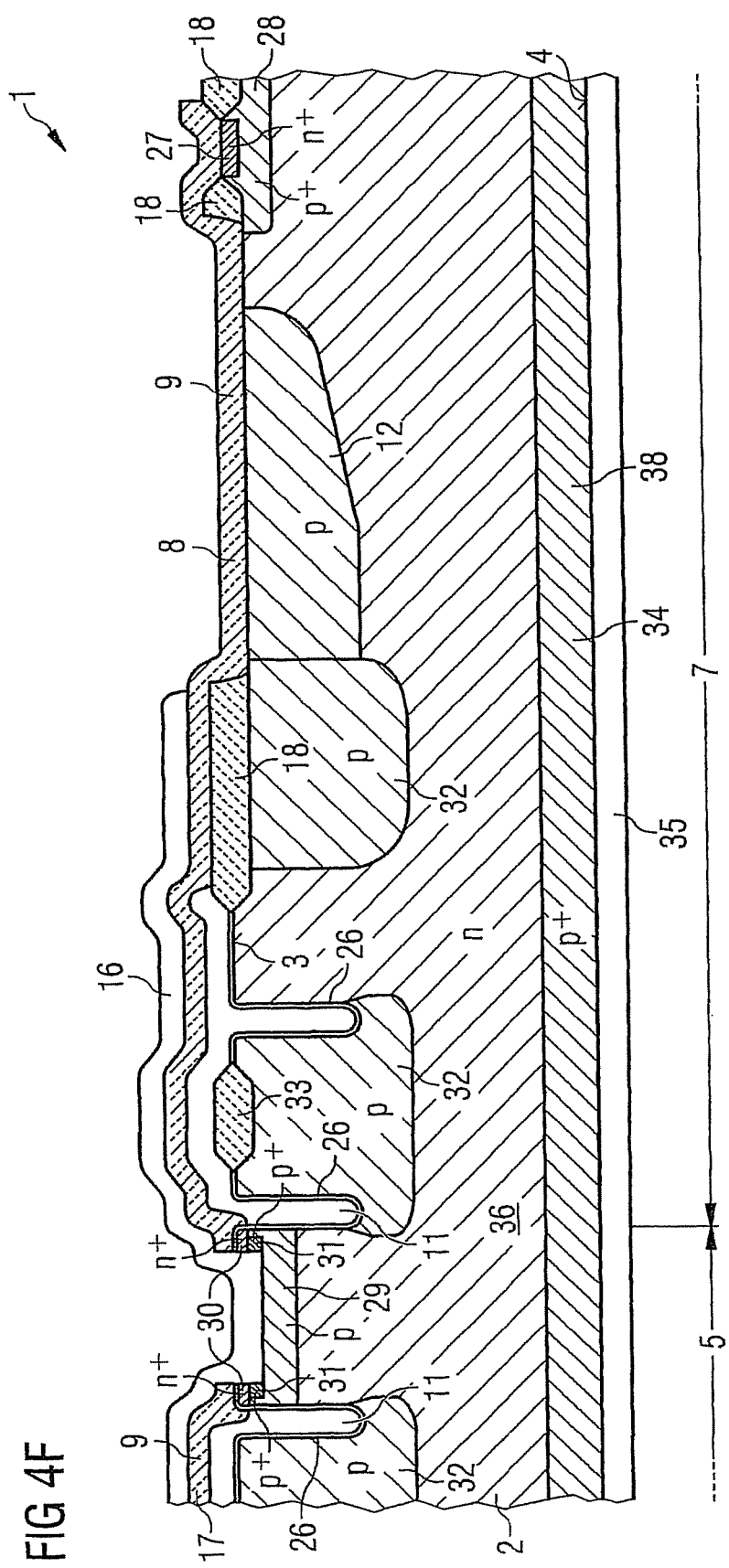

The photoresist mask 25 is subsequently removed and a conducting layer 16 is deposited and structured at least on parts of the semiconducting insulation layer 9 and in the region of the contact holes. The semiconductor device 1 obtained in this manner is illustrated in FIG. 4F.

FIGS. 5A to 5F illustrate a method for the production of a semiconductor device according to FIG. 2. Components of the same function as those in the previous figures are identified by the same reference numbers and not explained again below.

As in the previously described methods according to FIGS. 3 and 4, a production of a semiconductor device structure takes place in the active cell region 5 and a production of an edge structure takes place in the edge region 7 surrounding the active cell region 5 according to a standard method, which is not explained in detail here. Additionally, a local oxidation layer 18 is applied at least partially to the front-sided surface 3 in the edge region 7 after the production of the edge structure. In contrast to the above-described methods, the local oxidation layer 18 is applied with a thickness which corresponds to the thickness of the insulation layer 26 of the trenchgate electrodes 11. The local oxidation layer 18 is thinned at least partially in further processes and thus has at least partially a thickness which corresponds to the thickness of a residual oxide in the active cell region 5. FIG. 5A illustrates the semiconductor device 10 after the above-mentioned processes.

Figure 5B:
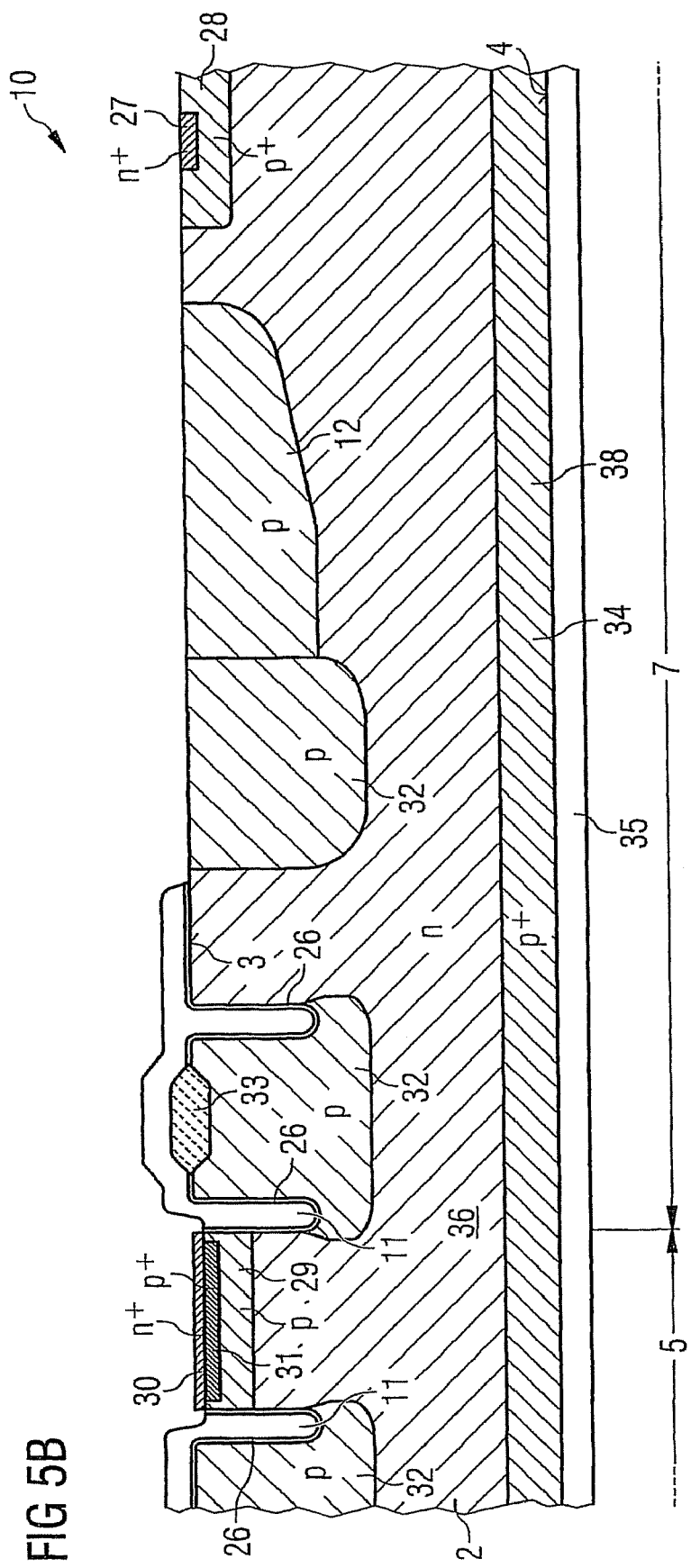

The thinned local oxidation layer 18 and the residual oxide in the active cell region 5 provided by the exposed parts of the insulation layer 26 of the trenchgate electrode 11 are subsequently removed in a wet-chemical process. FIG. 5B illustrates the semiconductor device 10 after the above-mentioned processes.

Figure 5C:
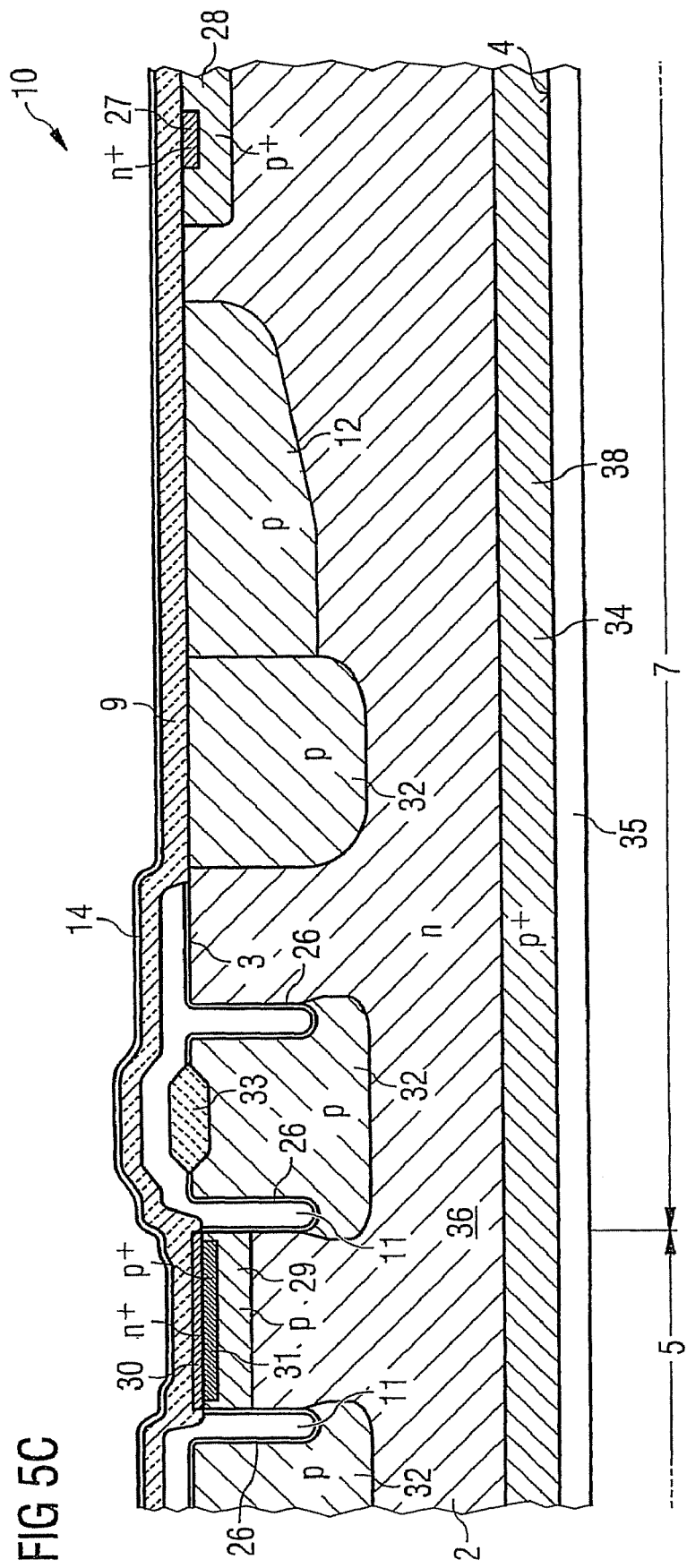

In a further process, a semiconducting insulation layer 9 is deposited on the front-sided surface 3 of the semiconductor body 2 both on the active cell region 5 and on the edge region 7. A semiconducting material is used for this, the bandgap of which is greater than the bandgap of the material of the semiconductor body 2, which typically contains silicon. In the same process, a layer 14 is applied to the semiconducting insulation layer 9. This can be done by a switching of process gases. For the layer 14, silicon nitride or a silicate glass, chosen from the group of the boron phosphorous silicate glasses, boron silicate glasses and the undoped silicate glasses, may be used. A corresponding layer 14 can also be applied to the semiconducting insulation layer 9 in the methods illustrated in FIGS. 3 and 4. FIG. 5C illustrates the semiconductor device 10 after the above-mentioned processes.

A photoresist mask 37 is subsequently applied to the layer 14 and is structured for providing contact holes in the active cell region 5, as illustrated in FIG. 5D.

Subsequently, a contact hole etching with removal of the semiconducting insulation layer 9 and the layer 14 in the region of the contact hole openings and the removal of the photoresist mask 37 takes place. This is illustrated in FIG. 5E.

In a further process, a conducting layer 16 is deposited and structured at least on parts of the layer 14. The semiconductor device 1 obtained in this manner is illustrated in FIG. 5F.

In another embodiment of the method, the conducting layer 16 is applied directly on the semiconducting insulation layer 9. Thus, after the deposition of the semiconducting insulation layer 9, a photoresist mask is applied thereto and is structured for providing contact holes in the active cell region 5. Subsequently, a contact hole etching with removal of the semiconducting insulation layer 9 in the region of the contact hole openings and the removal of the photoresist mask takes place with subsequent deposition and structuring of the conducting layer 16 at least on parts of the semiconducting insulation layer 9.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device with a semiconductor body, comprising:
   a front-sided surface;
   an active cell region including a semiconductor device structure; and
   an edge region surrounding the active cell region;
   wherein a layer on the front-sided surface includes a passivation layer over the edge region and over the active cell region, the passivation layer including a semiconducting insulation layer of a semiconducting material, a bandgap of the semiconducting insulation layer being greater than a bandgap of the material of the semiconductor body,
   wherein a conducting layer is arranged at least partially on the semiconducting insulation layer,
   wherein a further layer is arranged at least partially between the semiconducting insulation layer and the conducting layer,
   wherein the further layer includes a silicate glass, selected from the group of boron phosphorous silicate glasses, boron silicate glasses and of the undoped silicate glasses, and
   wherein the semiconducting material of the semiconducting insulation layer includes silicon-doped amorphous carbon.

2. The semiconductor device of claim 1, wherein the semiconducting material of the semiconducting insulation layer has an interface state density which is greater than the quotient of a breakdown charge and the bandgap of the material of the semiconductor body.

3. The semiconductor device of claim 1, wherein the material of the semiconductor body includes silicon.

4. The semiconductor device of claim 1, wherein the edge region includes at least one variably laterally doped doping material zone.

5. The semiconductor device of claim 1, wherein the edge region includes at feast one guard ring.

6. The semiconductor device of claim 1, wherein the edge region includes at least one field plate.

7. The semiconductor device of claim 1, wherein the edge region includes a channel stopper.

8. The semiconductor device of claim 1, wherein the further layer includes silicon nitride.

9. The semiconductor device of claim 1, wherein the semiconductor device structure includes at least one unipolar semiconductor device.

10. The semiconductor device of claim 1, wherein the semiconductor device structure includes at least one bipolar semiconductor device.

11. The semiconductor device of claim 1, wherein the semiconductor device structure includes at least one MOSFET.

12. The semiconductor device of claim 1, wherein the semiconductor device structure includes at least one diode.

13. A semiconductor device with a semiconductor body, comprising:
    a front-sided surface;
    an active cell region including a semiconductor device structure; and
    an edge region surrounding the active cell region;
    wherein a layer on the front-sided surface includes a passivation layer over the edge region and over the active cell region, the passivation layer including a semiconducting insulation layer of a semiconducting material, a bandgap of the semiconducting insulation layer being greater than a bandgap of the material of the semiconductor body,
    wherein at least one trench gate electrode is arranged in the active cell region.

14. A semiconductor device with a semiconductor body, comprising:
    a front-sided surface;
    an active cell region including a semiconductor device structure; and
    an edge region surrounding the active cell region;
    wherein a layer on the front-sided surface includes a passivation layer over the edge region and over the active cell region, the passivation layer including a semiconducting insulation layer of a semiconducting material, a bandgap of the semiconducting insulation layer being greater than a bandgap of the material of the semiconductor body, wherein the semiconductor device structure includes at least one IGBT.

15. A semiconductor device with a semiconductor body, comprising:

a front-sided surface;

an active cell region including a semiconductor device structure; and an edge region surrounding the active cell region;

wherein a layer on the front-sided surface includes a passivation layer over the edge region and over the active cell region, the passivation layer including a semiconducting insulation layer of a semiconducting material, a bandgap of the semiconducting insulation layer being greater than a bandgap of the material of the semiconductor body, wherein a conducting layer is arranged at least partially on the semiconducting insulation layer, wherein a further layer is arranged at least partially between the semiconducting insulation layer and the conducting layer, wherein the further layer includes a silicate glass, selected from the group of boron phosphorous silicate glasses, boron silicate glasses and of the undoped silicate glasses, and wherein the further layer directly contacts the semiconducting insulation layer and the conducting layer.

16. The semiconductor device of claim 15, wherein the semiconducting material of the semiconducting insulation layer includes amorphous carbon.

17. The semiconductor device of claim 15, wherein the semiconducting material of the semiconducting insulation layer includes hydrogenated amorphous carbon.

18. The semiconductor device of claim 15, wherein the semiconducting material of the semiconducting insulation layer has a resistivity in the range of $10^{12}$ Ωcm.

* * * * *